(12) United States Patent
Saito et al.

(10) Patent No.: US 10,714,853 B2
(45) Date of Patent: Jul. 14, 2020

(54) SEMICONDUCTOR STORAGE DEVICE

(71) Applicant: TOSHIBA MEMORY CORPORATION, Minato-ku (JP)

(72) Inventors: Toshitada Saito, Yokohama (JP);
Hideki Kawamura, Yokosuka (JP);
Atsushi Kondo, Yokohama (JP);
Katsuyoshi Watanabe, Fujisawa (JP);
Taku Nishiyama, Yokohama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/287,630

(22) Filed: Feb. 27, 2019

(65) Prior Publication Data
US 2019/0393633 A1 Dec. 26, 2019

(30) Foreign Application Priority Data

Jun. 25, 2018 (JP) .................... 2018-120095

(51) Int. Cl.
*H01R 12/72* (2011.01)
*H05K 5/02* (2006.01)
*H05K 1/18* (2006.01)

(52) U.S. Cl.
CPC ......... *H01R 12/725* (2013.01); *H05K 5/0247* (2013.01); *H05K 1/181* (2013.01); *H05K 2201/10159* (2013.01); *H05K 2201/10522* (2013.01)

(58) Field of Classification Search
CPC ............. H01R 12/725; H05K 5/0247; H05K 2201/10159; H05K 2201/10522
See application file for complete search history.

(56) References Cited

U.S. PATENT DOCUMENTS

| 7,360,713 | B2 | 4/2008 | Nishizawa et al. |
| 7,543,757 | B2 | 6/2009 | Nishizawa et al. |
| 8,274,141 | B2 | 9/2012 | Nishiyama et al. |

(Continued)

FOREIGN PATENT DOCUMENTS

| JP | 2009-252036 | 10/2009 |
| JP | 2009-259207 | 11/2009 |

(Continued)

*Primary Examiner* — Abdullah A Riyami
*Assistant Examiner* — Nader J Alhawamdeh
(74) *Attorney, Agent, or Firm* — Oblon, McClelland, Maier & Neustadt, L.L.P.

(57) ABSTRACT

According to one embodiment, a semiconductor storage device includes a housing, a plurality of terminals, signal terminals, a controller, signal wiring, and a memory. The housing has a first face and a second face opposite to the first face. The plurality of terminals is exposed to the first face, extends in a first direction, and is spaced apart in a second direction intersecting with the first direction. A signal terminal included in the plurality of terminals has a first end in the first direction, and a second end opposite to the first end in the first direction, the second end being closer to a contact position with a socket contact than the first end. The controller is located in the housing. The signal wiring extends from the first end in the housing and electrically connects the first end and the controller. The memory is electrically connected to the controller in the housing.

7 Claims, 8 Drawing Sheets

(56) References Cited

U.S. PATENT DOCUMENTS

| | | | | |
|---|---|---|---|---|
| 2006/0289500 A1* | 12/2006 | Okumura | ......... | G06K 19/07732 |
| | | | | 219/686 |
| 2009/0166829 A1* | 7/2009 | Nishiyama | ............. | G11C 5/063 |
| | | | | 257/676 |
| 2009/0254704 A1 | 10/2009 | Nakamura et al. | | |
| 2012/0049378 A1* | 3/2012 | Asada | ................. | H01L 23/3107 |
| | | | | 257/773 |
| 2013/0186960 A1* | 7/2013 | Suzuki | ............. | G06K 19/07732 |
| | | | | 235/492 |
| 2014/0168914 A1* | 6/2014 | Yokoyama | .............. | H01L 25/16 |
| | | | | 361/749 |
| 2016/0216728 A1* | 7/2016 | Happoya | ............. | H01L 23/5389 |
| 2017/0148492 A1 | 5/2017 | Han et al. | | |

FOREIGN PATENT DOCUMENTS

| | | | |
|---|---|---|---|
| JP | 2010-257394 | | 11/2010 |
| JP | 2013182291 A | * | 9/2013 |
| JP | 2017107530 A | * | 6/2017 |
| TW | I350964 | | 10/2011 |

* cited by examiner

FIG.1
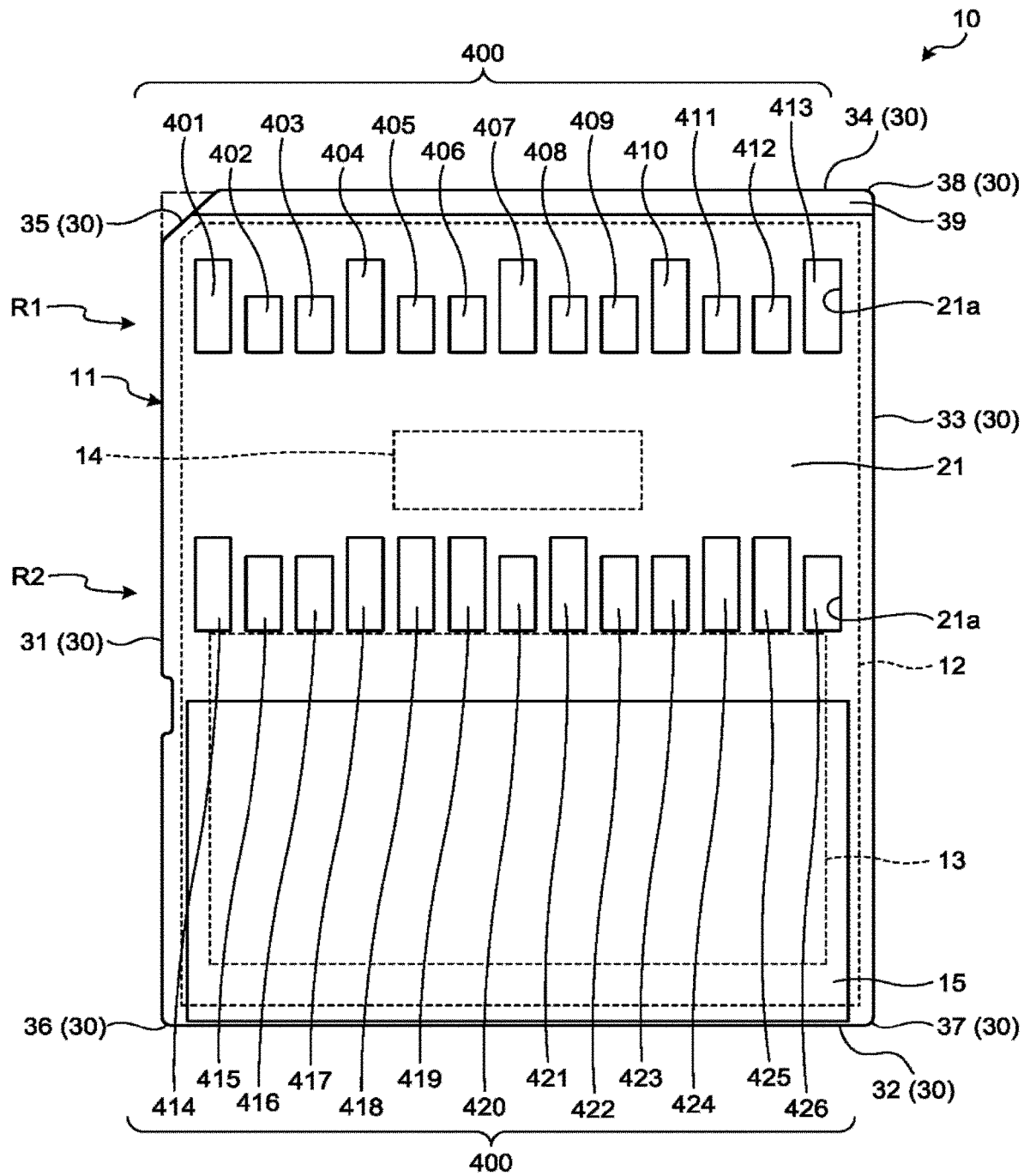
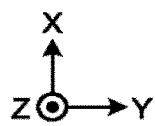

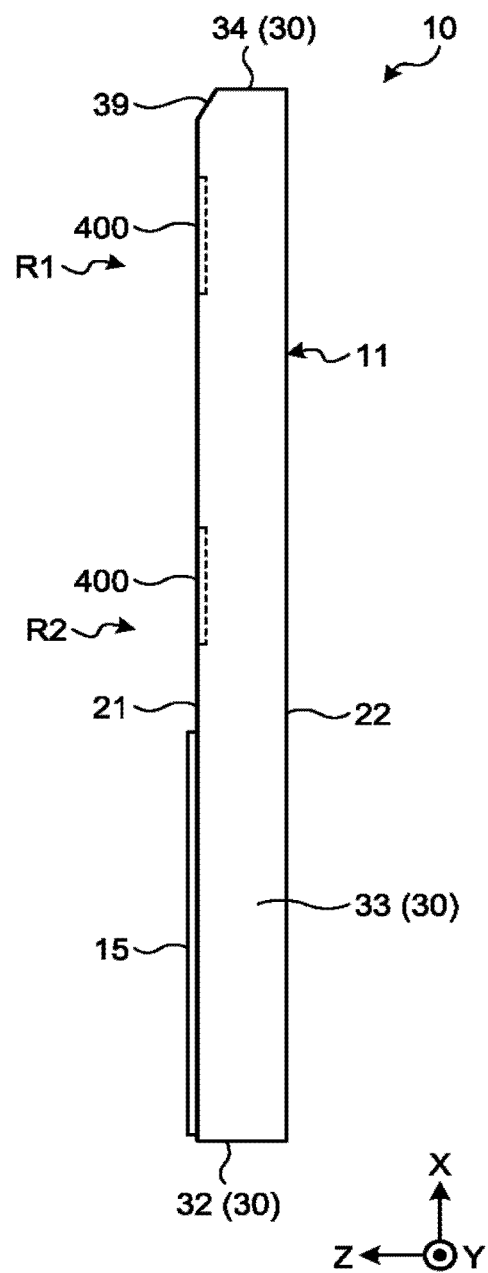

FIG.3

| TERMINAL NUMBER | SIGNAL NAME | FUNCTION | DESCRIPTION |
|---|---|---|---|
| 401 | GND | Ground | |
| 402 | PERp0 | Receiver differential pair, Lane 0 | PCIe RX Differential signals defined by the PCIe 3.0 specification |
| 403 | PERn0 | | |
| 404 | GND | Ground | |
| 405 | PETp0 | Transmitter differential pair, Lane 0 | PCIe TX Differential signals defined by the PCIe 3.0 specification |
| 406 | PETn0 | | |
| 407 | GND | Ground | |
| 408 | PERp1 | Receiver differential pair, Lane 1 | PCIe RX Differential signals defined by the PCIe 3.0 specification |
| 409 | PERn1 | | |
| 410 | GND | Ground | |
| 411 | PETp1 | Transmitter differential pair, Lane 1 | PCIe TX Differential signals defined by the PCIe 3.0 specification |
| 412 | PETn1 | | |
| 413 | GND | Ground | |
| 414 | GND | Ground | |
| 415 | REFCLKp | Reference clock differential pair | PCIe Reference Clock signals (100 MHz) defined by the PCIe 3.0 specification |
| 416 | REFCLKn | | |
| 417 | GND | Ground | |
| 418 | PWR_2 | Power Rail 2 | |
| 419 | PWR_2 | Power Rail 2 | |
| 420 | PERST# | Fundamental reset / 1.8V | functional reset to the card as defined by the PCIe Mini CEM specification |
| 421 | PWR_1 | Power Rail 1 | |
| 422 | CLKREQ# | Clock Request Signal / 1.8V open drain | reference clock request signal as defined by the PCIe Mini CEM specification |
| 423 | CNTA | Control Signal A | |
| 424 | PWR_3 | Power Rail 3 | |
| 425 | PWR_3 | Power Rail 3 | |
| 426 | CNTB | Control Signal B | |

SEMICONDUCTOR STORAGE DEVICE

CROSS-REFERENCE TO RELATED APPLICATIONS

This application is based upon and claims the benefit of priority from Japanese Patent Application No. 2018-120095, filed on Jun. 25, 2018; the entire contents of which are incorporated herein by reference.

FIELD

Embodiments described herein relate generally to a semiconductor storage device.

BACKGROUND

Conventionally, semiconductor storage devices including a plurality of terminals exposed to the surface of a housing are known (for example, described in JP2009-259207A).

It is useful to provide a semiconductor storage device with a novel configuration and less inconvenience, for example.

BRIEF DESCRIPTION OF THE DRAWINGS

FIG. 1 is a schematic and illustrative plan view of a semiconductor storage device of a first embodiment;

FIG. 2 is a schematic and illustrative side view of the semiconductor storage device of the first embodiment;

FIG. 3 is an illustrative table illustrating the assignment of signals to a plurality of terminals of a first embodiment;

DETAILED DESCRIPTION

Figure 4:
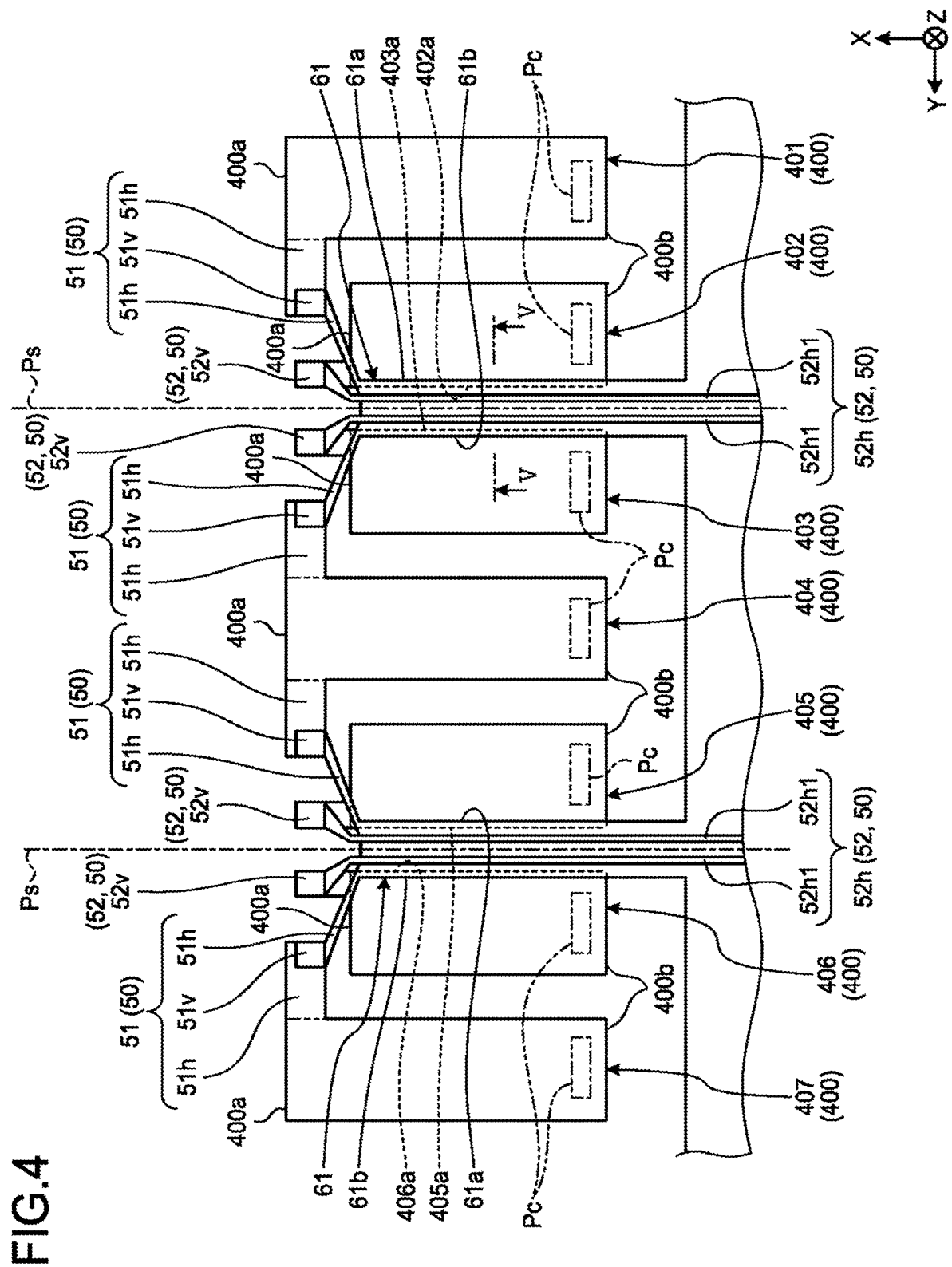
FIG. 4 is a schematic and illustrative plan view illustrating part of conductors in a housing of the semiconductor storage device of the first embodiment.

In general, according to one embodiment, a semiconductor storage device includes a housing, a plurality of terminals, signal terminals of the plurality of terminals, a controller in the housing, signal wiring, and a memory. The housing includes a first face and a second face opposite to the first face. The plurality of terminals is exposed to the first face, extends in a first direction, and is spaced apart from each other in a second direction intersecting with the first direction. Each of the signal terminals includes a first end in the first direction, and a second end opposite to the first end in the first direction. The second end is closer to a contact position with a contact of a host device than the first end. Signal wiring extends from the first end in the housing to electrically connect the first end and the controller. The memory is electrically connected to the controller in the housing.

Exemplary embodiments of the semiconductor storage device will be explained below in detail with reference to the accompanying drawings. The present invention is not limited to the following embodiments.

The following will illustrate the configurations and control as the technical features of embodiments and a modification and operations, results, and effects attained by the configurations and control, however, they are merely exemplary. The embodiments and modification to be illustrated below include similar or same components. In the following description, common reference numerals are assigned to similar or same components, and overlapping descriptions may be omitted. In the specification, the ordinal numbers are used to distinguish signals, values, and components, and are not intended to indicate priority and order.

In the specification, for the simplicity of description, directions are defined. In the drawings, a first direction along an arrow X is the longitudinal direction of a rectangular memory card 10 (hereinafter simply referred to as longitudinal direction), and a second direction along an arrow Y is the lateral direction of the memory card 10 (hereinafter simply referred to as lateral direction). A third direction along an arrow Z is the thickness direction of the memory card 10 (hereinafter simply referred to as thickness direction). The first, second, and third directions are perpendicular to one another. In the following description, the direction of the arrow X may be referred to as frontward in the first direction, a direction opposite to the direction of the arrow X as backward in the first direction, a direction of the arrow Y as frontward in the second direction, a direction opposite to the direction of the arrow Y as backward in the second direction, a direction of the arrow Z as frontward in the third direction, and a direction opposite to the direction of the arrow Z as backward in the third direction. The lateral direction can also be referred to as a width direction.

First Embodiment

FIG. 1 is a plan view of a memory card 10 of a first embodiment. FIG. 2 is a side view of the memory card 10. The memory card 10 is an example of a semiconductor storage device, and can be referred to as a removable medium or removable memory card.

As illustrated in FIG. 1, the memory card 10 includes a housing 11, a board 12, a flash memory 13, a card controller 14, and a protective sheet 15.

As illustrated in FIGS. 1 and 2, the housing 11 has, for example, a substantially oblong plate shape or rectangular plate shape. The housing 11 has a substantially constant thickness. In other words, the housing 11 has a thin flat cuboid shape in the third direction (Z direction).

The housing 11 includes a first face 21, a second face 22, and an outer edge 30. The first face 21 and the second face 22 have a substantially oblong or rectangular shape. The first face 21 and the second face 22 intersect with or are substantially perpendicular to the third direction.

The outer edge 30 includes a first edge 31, a second edge 32, a third edge 33, a fourth edge 34, a first corner 35, a second corner 36, a third corner 37, and a fourth corner 38.

The first edge 31 and the third edge 33 extend in the first direction (X direction), and are substantially parallel to each other. The second edge 32 and the fourth edge 34 extend in the second direction (Y direction), and are substantially parallel to each other. The first edge 31 and the third edge 33 are longer than the second edge 32 and the fourth edge 34. The first edge 31 and the third edge 33 can be referred to as long sides, and the second edge 32 and the fourth edge 34 as short sides.

The first corner 35 is located between the first edge 31 and the fourth edge 34, the second corner 36 between the first edge 31 and the second edge 32, the third corner 37 between the second edge 32 and the third edge 33, and the fourth corner 38 between the third edge 33 and the fourth edge 34.

The first corner 35 has a chamfered shape. In other words, the first corner 35 is provided with a chamfered cutout. In plan view in FIG. 1, an edge of the first corner 35 intersects with the first edge 31 and the fourth edge 34 at angle of 45°. In plan view in FIG. 1, an isosceles right triangle, indicated by a chain double-dashed line, cut out from the first corner 35 has, for example, an apex angle of 90° and two hypotenuses of 1.1 mm. The shape of the cutout of the first corner 35 is not limited to the chamfered shape.

The second corner 36, the third corner 37, and the fourth corner 38 have a round chamfered shape. In other words, the second corner 36, the third corner 37, and the fourth corner 38 are each provided with a round chamfered cutout. In plan view in FIG. 1, a radius of curvature of each of the second corner 36, the third corner 37, and the fourth corner 38 is, for example, set to 0.2 mm. In other words, the second corner 36, the third corner 37, and the fourth corner 38 are each provided with a smaller cutout than the first corner 35.

The lengths of the memory card 10, the housing 11, the first face 21, and the second face 22 in the first direction are set at, for example, approximately 18±0.1 mm, and lengths thereof in the second direction are set at, for example, approximately 14±0.1 mm. The shapes and dimensions of the memory card 10, the housing 11, the first face 21, and the second face 22 are not limited to this example.

As illustrated in FIG. 2, the housing 11 includes an inclined part 39 at a corner (boundary) between the first face 21 and the fourth edge 34. In side view in FIG. 2, the inclined part 39 forms a chamfered cutout between the first face 21 and the fourth edge 34.

As illustrated in FIG. 1, the board 12, the flash memory 13, and the card controller 14 are placed inside the housing 11. The board 12, the flash memory 13, and the card controller 14 may be embedded in the housing 11, or housed in a case being the housing 11.

The board 12 is, for example, a printed wiring board (PWB). The board 12 may be another type of board such as flexible printed circuit (FPC). The flash memory 13 and the card controller 14 are mounted on the board 12. The flash memory 13 and the card controller 14 are examples of electronic components as electrical components and parts. Electronic components as electrical components and parts other than the flash memory 13 and the card controller 14 may be mounted on the board 12. The board 12 extends in the first and second directions and also intersects with or is substantially perpendicular to the third direction. The first direction is the longitudinal direction of the board 12. The second direction is the lateral direction of the board 12. The third direction is the thickness direction of the board 12.

The flash memory 13 is a data-rewritable nonvolatile memory, for example, a NAND flash memory. The flash memory 13 may be another type of flash memory such as NOR flash memory. The memory card 10 may include, for example, a plurality of flash memories 13, or the plurality of flash memories 13 may be layered. The flash memory 13 is an example of a memory.

The card controller 14 and the flash memory 13 are electrically connected via wiring (not illustrated in FIGS. 1 and 2) laid on the board 12. The card controller 14 can control the operation of the flash memory 13, and the entire operation of the memory card 10 including the flash memory 13. For example, the card controller 14 can control data read from the flash memory 13, data write to the flash memory 13, and data communication between the card controller 14 and an external device. The data communication control includes protocol control pursuant to the peripheral component interconnect express (PCIe) standard. The card controller 14 may indirectly control the flash memory 13 via another electronic component that controls the flash memory 13. The card controller 14 is an example of a controller.

The protective sheet 15 is affixed onto the first face 21. The protective sheet 15 covers, for example, a test terminal (not illustrated) exposed to the first face 21. The protective sheet 15 is not limited to this example.

The memory card 10 includes a plurality of terminals 400 (401 to 426). The terminals 400 have a quadrangular shape, for example, a long oblong shape in the first direction or X direction in the first embodiment. In other words, the first direction is the longitudinal direction of the terminals 400, and the second direction or Y direction is the lateral or width direction of the terminals 400. The third direction or Z direction is the thickness direction of the terminals 400.

The number of the terminals 400 is 26 as an example in the first embodiment. The number of the terminals 400 is not limited to 26, and may be less than or more than 26. The terminals 400 are provided to, for example, the board 12.

Each of the terminals 400 is exposed from an opening 21*a* in the first face 21. In other words, each of the terminals 400 is exposed to the outside of the housing 11 on the first face 21. Without the terminals 400, the second face 22 can serve as, for example, a heat dissipation face, a print face, and a display face. However, the terminals 400 may be mounted on the second face 22, and be exposed to the outside of the housing 11.

The terminals 400 include a first row R1 of terminals 400 (401 to 413), and a second row R2 of terminals 400 (414 to 426) in the second direction (Y direction). The terminals 400 in the first row R1 are spaced apart from each other in the second direction. The terminals 400 in the second row R2 are spaced apart from each other in the second direction. The first row R1 and the second row R2 are spaced apart in the first direction. The first row R1 is aligned along the fourth edge 34 closer to the fourth edge 34 than the second row R2. The second row R2 is located in the middle between the second edge 32 and the fourth edge 34 and closer to the second edge 32 than the first row R1. The number of rows of the terminals 400 may be one, or three or more.

In the first row R1, the shapes of the terminals 401, 404, 407, 410, and 413 are substantially the same, the shapes of the terminals 402, 403, 405, 406, 408, 409, 411, and 412 are substantially the same, and the shape of the terminals 401, 404, 407, 410, and 413 is different from the shape of the terminals 402, 403, 405, 406, 408, 409, 411, and 412. The terminals 401, 404, 407, 410, and 413 are longer than the terminals 402, 403, 405, 406, 408, 409, 411, and 412 in the first direction. The widths of the terminals 401 to 413 in the second direction are substantially equal to one another. Thus, the first row R1 includes two types of the terminals 400 that are different in shape. The first row R1 may include three or more types of the terminals 400 that are different in shape.

In the second row R2, the shapes of the terminals 414, 417, 418, 419, 421, 424, and 425 are substantially the same, the shapes of the terminals 415, 416, 420, 422, 423, and 426 are substantially the same, and the shape of the terminals 414, 417, 418, 419, 421, 424, and 425 is different from the shape of the terminals 415, 416, 420, 422, 423, and 426. The terminals 414, 417, 418, 419, 421, 424, and 425 are longer than the terminals 415, 416, 420, 422, 423, and 426 in the first direction. The widths of the terminals 414 to 426 in the second direction are substantially equal to one another. Thus, the second row R2 includes two types of the terminals 400. The first row R1 and the second row R2 may or may not include the terminals 400 of the same shape. The shapes of the terminals 400 in the first row R1 and the shapes of the terminals 400 in the second row R2 are not limited to this example. The second row R2 may include three or more types of the terminals 400 that are different in shape.

The terminals 400 may be assigned with signals used in communication pursuant to one interface standard, or signals used in communication pursuant to multiple interface standards.

FIG. 3 is an illustrative table illustrating an example of the signal assignment to the terminals 400. As illustrated in FIG. 3, in the embodiment, the terminals 400 in the first row R1 are assigned with signals used in PCIe data communication. In PCIe data communication, differential data signal pairs can be used.

In the first row R1, a ground potential (GND) is assigned to the terminals 401, 404, 407, 410, and 413. The terminals 401, 404, 407, 410, and 413 are examples of a ground terminal.

The terminals 402, 403, 405, 406, 408, 409, 411, and 412 transmit a differential data signal pursuant to PCIe, and can communicate bidirectionally. The terminals 402, 403, 405, 406, 408, 409, 411, and 412 transmit a differential data signal in a GHz frequency band. Each of pairs of the terminals 402 and 403, the terminals 405 and 406, the terminals 408 and 409, and the terminals 411 and 412 transmit a pair of differential data signals or differential signals. The terminals 402, 405, 408, and 411 are examples of a first signal terminal, and the terminals 403, 406, 409, and 412 are examples of a second signal terminal.

Receiver differential signals PERp0, PERn0, PERp1, and PERn1 are assigned to the terminals 402, 403, 408, and 409. Transmitter differential signals PETp0, PETn0, PETp1, and PETn1 are assigned to the terminals 405, 406, 411, and 412. The receiver differential signals PERp0, PERn0, PERp1, and PERn1 and the transmitter differential signals PETp0, PETn0, PETp1, and PETn1 are examples of the differential signal and the differential data signal. The terminals 402, 403, 405, 406, 408, 409, 411, and 412 are examples of a differential signal terminal and a differential data signal terminal.

As illustrated in FIG. 1, the terminals 402 and 403 to which the receiver differential signals PERp0 and PERn0 are assigned are located between two terminals 401 and 404. The terminals 405 and 406 to which the transmitter differential signals PETp0 and PETn0 are assigned are located between two terminals 404 and 407.

As illustrated in FIG. 1, the terminals 408 and 409 to which the receiver differential signals PERp1 and PERn1 are assigned are located between two terminals 407 and 410. The terminals 411 and 412 to which the transmitter differential signals PETp1 and PETn1 are assigned are located between two terminals 410 and 413.

A 8$b$/10$b$ or 128$b$/130$b$ line code is used for PCIe encoding. In the case of PCIe 3.0, the maximum transfer speed is 2G bites/second per lane as a total of upstream and downstream. In PCIe, a transmitter differential signal pair PETp0 and PETn0 and a receiver differential signal pair PERp0 and PERn0 can constitute one lane. In PCIe, a transmitter differential signal pair PETp1 and PETn1 and a receiver differential signal pair PERp1 and PERn1 can constitute another lane. Two-lane assignment to the terminals 400 of the first row R1 can increase the number of lanes and improve the data transfer speed in PCIe.

By PCIe, a multiple-lane configuration is identified at the time of initialization to be able to transmit a piece of data in multiple lanes. If a host device does not support multiple lanes, the memory card 10 can operate in one lane mode.

Control signals used for communication control by PCIe are assigned to the terminals 414 to 426 (400) in the second row R2. In the second row R2, GND is assigned to the terminals 414 and 417, reference differential clock signals REFCLKp and REFCLKn are assigned to the terminals 415 and 416, a second power supply PWR2, i.e., a power rail is assigned to the terminals 418 and 419, a reset signal PERST # is assigned to the terminal 420, a first power supply PWR1, i.e., a power rail is assigned to the terminal 421, a power management control signal CLKREQ # is assigned to the terminal 422, control signals CNTA and CNTB are assigned to the terminals 423 and 426, and a third power supply PWR3 being a power rail is assigned to the terminals 424 and 425.

The reference differential clock signals REFCLKp and REFCLKn are differential clock signals. By transmission of a clock signal in a MHz frequency band from the host device to the terminals 415 and 416, the memory card 10 can be easily synchronized with the host device where the memory card 10 is mounted. Herein, the frequency of the clock signal that the terminals 415 and 416 use for transmission is set to be lower than the frequency of the differential data signal that the terminals 402, 403, 405, 406, 408, 409, 411, and 412 use for transmission, and also set in an approximately sinusoidal waveform. Consequently, the occurrence of EMI can be prevented.

The terminals 415, 416, 420, 422, 423, and 426 are examples of a signal terminal. The terminals 415 and 416 are examples of the differential signal terminal and a differential clock signal terminal. The terminals 420, 422, 423, and 426 are examples of a single-ended signal terminal. The terminals 420 and 422 are examples of a sideband signal terminal. The terminals 418, 419, 421, 424, and 425 are examples of a power supply terminal. The terminals 418 and 419 are examples of a second power supply terminal. The terminal 421 is an example of a first power supply terminal. The terminals 424 and 425 are examples of a third power supply terminal. Thus, the memory card 10 including the terminals 400 being the power supply terminals can distribute current to reduce current passing through each terminal and reduce voltage drop due to a resistance component present between the power supply circuit and the power supply terminals.

The host device represents, for example, an information processing device such as a personal computer, a mobile phone, a digital camera, an imaging device, a mobile terminal such as a tablet computer or smartphone, a game machine, a vehicle-mounted terminal such as a car navigation system, or another device. The host device can also be referred to as an electronic device.

The memory card 10 multiplies a received differential reference clock in a PLL oscillation circuit and generates a bit clock. Data is outputted from the transmitter differential signals PETp0, PETn0, PETp1, and PETn1 in synchronization with the bit clock. Data read from the receiver differential signals PERp0, PERn0, PERp1, and PERn1 is merged into one piece of data in synchronization with the bit clock.

In other words, it is possible to temporarily receive data by a receiver clock generated from a code and re-synchronize the received data with the differential reference clock.

The host device can use the reset signal PERST # to reset a bus to be used for PCIe communication. By a PCIe timing specification for reset cancellation, an initialization start timing of a PCIe differential lane is defined. The host device can use the reset signal PERST # for re-initialization of the memory card 10 at the time of occurrence of error, for example.

The power management control signal CLKREQ # can be used as a clock for returning from a power saving mode. In power saving mode, a radio-frequency bit clock used for data transfer is stopped to enable a reduction in power consumption.

The control signals CNTA and CNTB can be used to control various functions. For example, as described below, the control signal CNTB can be used to determine whether PCIe initialization requires the third power supply PWR3 or the second power supply PWR2, or is operable only with the first power supply PWR1.

The reset signal PERST #, the power management control signal CLKREQ #, and the control signals CNTA and CNTB are single-ended signals. The reset signal PERST # and the power management control signal CLKREQ # are PCIe sideband signals.

The memory card 10 supports communication based on PCIe to be able to employ the PCIe standard physical layer. This makes it possible to facilitate the design of the memory card 10 for increasing the data transfer speed with reduction in development costs.

Furthermore, the memory card 10 supports communication based on PCIe to be able to adopt nonvolatile memory express (NVMe) for the PCIe data link layer. This can reduce overhead during data transfer and improve data transfer efficiency.

The host device can supply first power PWR1 to the terminal 421. The first power PWR1 is set at 3.3 V in the embodiment. The represented power supply indicates median values, and voltage variations are permitted to some extent. The first power PWR1 can be set in, for example, the range of 2.5 V or more to 3.3 V or less, but is not limited to this example.

The host device can supply second power PWR2 as a second power supply to the terminals 418 and 419. The second power PWR2 is an example of a second power supply. The second power PWR2 is set at 1.8 V in the embodiment. In other words, the second power PWR2 is equal to or less than the first power PWR1. The second power PWR2 can be set in, for example, the range of 1.2 V or more to 1.8 V or less, but is not limited to this example.

The host device can supply third power PWR3 as a third power supply to the terminals 424 and 425. The third power PWR3 is an example of a first power supply. The third power PWR3 is set at 1.2 V in the embodiment. In other words, the third power PWR3 is equal to or less than the second power PWR2. The third power PWR3 is not limited to this example.

FIG. 4 is a plan view of part of conductors in the housing 11 when viewed from the second face 22. For easier understanding, FIG. 4 omits illustrating insulating layers as insulators of the board 12 and the housing 11. The conductors include wiring 50 and a ground layer 60.

As described above, the terminals 401, 404, and 407 are examples of a ground terminal, and the terminals 402, 403, 405, and 406 are examples of a signal terminal. As illustrated in FIG. 4, each of the terminals 401, 404, and 407 is electrically connected to the ground layer 60 via wires 51 being another example of the wiring 50. Each of the terminals 402, 403, 405, and 406 is electrically connected to the card controller 14 (refer to FIG. 1) via wires 52 being an example of the wiring 50. The wires 51 are an example of ground wiring, and the wires 52 are an example of signal wiring.

The terminals 400, the wiring 50, and the ground layer 60 are provided to the board 12. As described above, the board 12 extends substantially in the first direction (X direction) and the second direction (Y direction), and intersects with or is substantially perpendicular to the third direction (Z direction). The terminals 400 and the ground layer 60 extend in the first and second directions, and intersect with or are substantially perpendicular to the third direction. The wires 51 and 52 include horizontal sections 51$h$ and 52$h$ intersecting with or substantially perpendicular to the third direction, and vertical sections 51$v$ and 52$v$ extending in the third direction.

The terminals 400, the wiring 50, and the ground layer 60 can be formed in the manufacturing process of the board 12. Specifically, for example, the board 12 is a multilayer board including conductive layers and insulating layers placed on top of each other, and the terminals 400, the ground layer 60, and the horizontal sections 51$h$ and 52$h$ of the wires 51 and 52 can be configured as conductive layers intersecting with the third direction. The vertical sections 51$v$ and 52$v$ of the wires 51 and 52 may be configured as blind vias such as stacked vias or staggered vias extending in the third direction, or configured as through vias in the inner peripheries of through-holes.

Each of the terminals 400 has an oblong shape having long sides in the first direction, i.e., the X direction and the longitudinal direction of the terminals 400, and short sides in the second direction, i.e., the Y direction and the lateral direction of the terminals 400. Each terminal 400 includes a front (top in FIG. 4) end 400$a$ in the first direction, and a back (bottom in FIG. 4) end 400$b$ in the first direction. The end 400$a$ is an example of a first end, and the end 400$b$ is an example of a second end.

An extension 61 being part of the ground layer 60 is electrically connected to two ground terminals, for example, the terminals 401 and 404, or the terminals 404 and 407, and extends in the first direction. Extensions 52$h$1 being part of the horizontal sections 52$h$ of the wires 52 are electrically connected to the terminals 402, 403, 405, and 406, and extend in the first direction. The extension 61 is an example of a first area.

Figure 5:
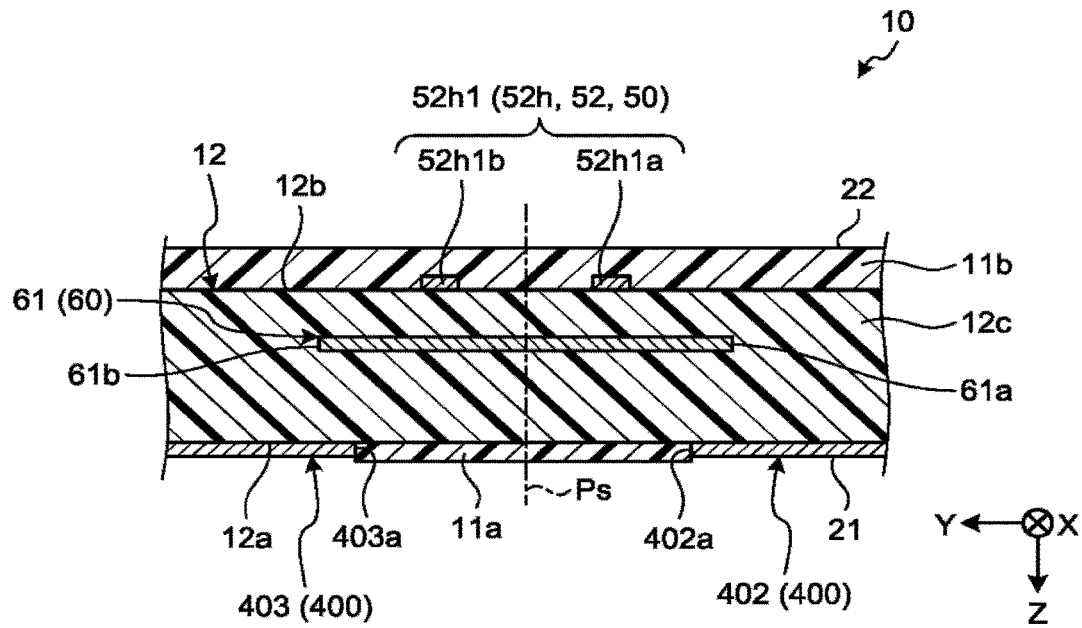
FIG. 5 is a schematic and illustrative cross-sectional view along line V-V in FIG. 4 of the semiconductor storage device of the first embodiment.

FIG. 5 is a cross-sectional view of the memory card 10 along line V-V in FIG. 4. As illustrated in FIG. 5, the terminals 402 and 403 (400), the extension 61 of the ground layer 60, and the extensions 52$h$1 of the horizontal sections 52$h$ are spaced apart from each other in the third direction (Z direction). The extension 52$h$1 is part of a conductive layer formed on a second face 12$b$ of the board 12. Insulating layers 12$c$ are interposed between conductive layers of the board 12. The second face 12$b$ is located opposite a first face 12$a$ of the board 12. The first face 12$a$ and the second face 12$b$ of the board 12 are substantially parallel to the first face 21 and the second face 22 of the housing 11. The first face 12$a$ is covered with an insulating layer 11$a$, and the second face 12$b$ is covered with an insulating layer 11$b$.

Figure 6:
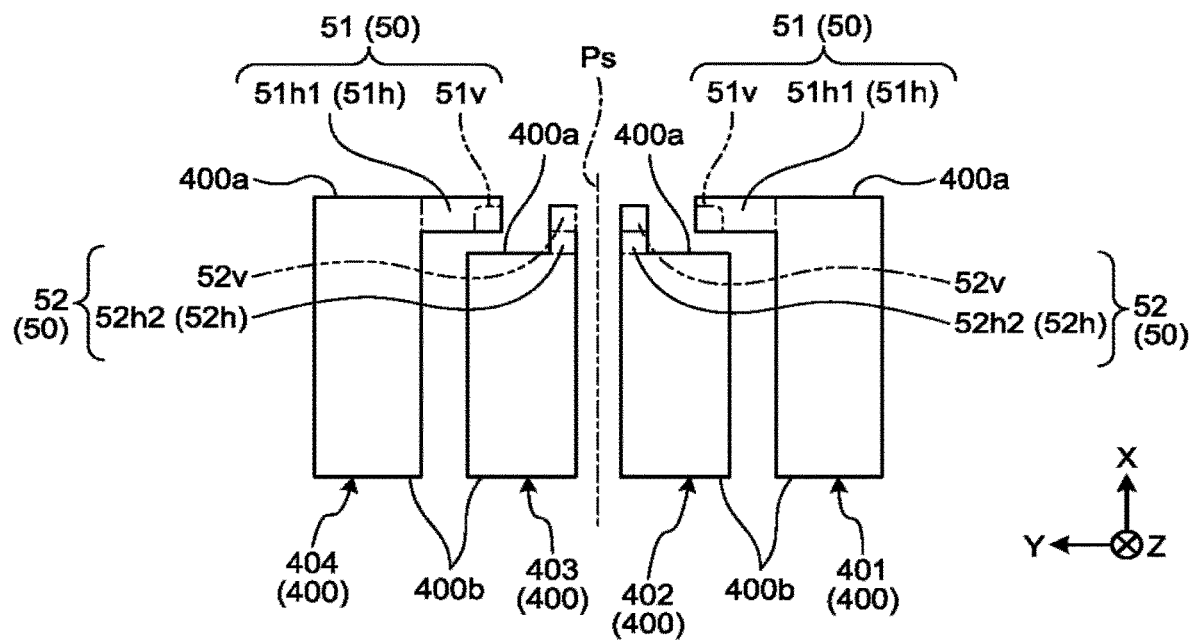
FIG. 6 is a schematic and illustrative plan view illustrating part of terminals and part of wiring corresponding to the terminals in the semiconductor storage device of the first embodiment.

FIG. 6 is a plan view illustrating the terminals 401 to 404 and part of the wires 51 and 52 corresponding to the terminals 401 to 404. FIG. 6 omits showing the insulating layers as insulators of the board 12 and the housing 11.

The terminals 401 to 404 are part of the conductive layer on the first face 12a of the board 12, the part being exposed from the openings 21a (refer to FIG. 1) in the insulating layer 11a (refer to FIG. 5) that covers the first face 12a and forms the first face 21 of the housing 11.

The terminals 401 and 404 are longer than the terminals 402 and 403 in the first direction (X direction), and the ends 400b of the terminals 401 to 404 are aligned in the second direction (Y direction). Hence, the ends 400a of the terminals 401 and 404 are located with spacing frontward (upward in FIG. 6) of the ends 400a of the terminals 402 and 403 in the first direction.

In the memory card 10 to be inserted into the socket of the host device, such a difference in length between the terminals 401 and 404 and the terminals 402 and 403 and the arrangement of the terminals 401 to 404 are useful to align the first direction (X direction) with the direction of insertion or mounting into the socket of the host device. This is because, for insertion of the memory card 10 into the socket, such a configuration can prevent occurrence of an inconvenient event such as electrical potential rising in the terminals 401 and 404 and in a not-illustrated interface circuit, which would otherwise occur due to the electrical contact between the contacts of the host device and the ground terminals prior to the terminals 402 and 403 being the signal terminals.

Extensions 51h1 of the wires 51 extend from the ends 400a of the terminals 401 and 404, approaching each other in the second direction. The extensions 51h1 are located with spacing frontward of the ends 400a of the terminals 402 and 403 in the first direction. Extensions 52h2 of the wires 52 protrude frontward in the first direction from the ends 400a of the terminals 402 and 403. The extensions 52h2 protrude from opposing ends of the ends 400a of the terminals 402 in the first direction.

The vertical sections 51v protrude from the extensions 51h1 of the wires 51, distancing away from the first face 12a of the board 12 in the third direction, i.e., Z direction. The vertical sections 52v protrude from the extensions 52h2 of the wires 52, distancing away from the first face 12a of the board 12 in the third direction.

Figure 7:
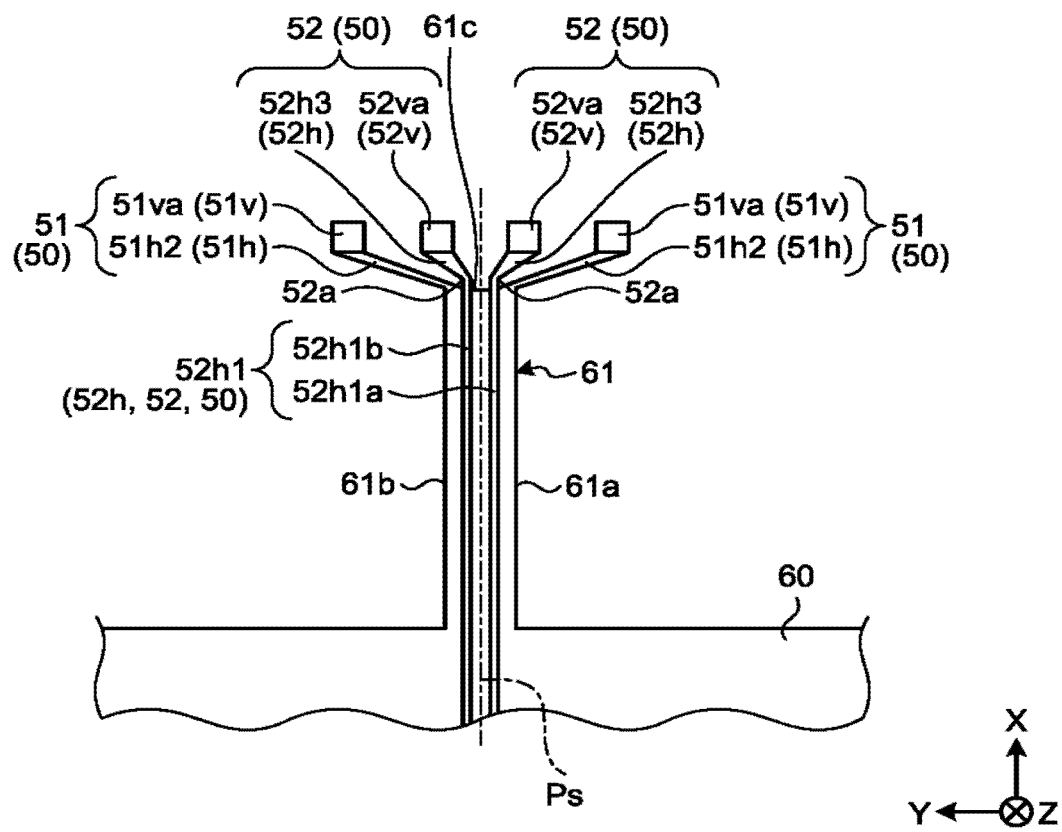
FIG. 7 is a schematic and illustrative plan view illustrating part of the wiring corresponding to the terminals illustrated in FIG. 6 and part of a ground layer in the semiconductor storage device of the first embodiment.

FIG. 7 is a plan view illustrating the wires 51 and 52 corresponding to the terminals 401 to 404 and the ground layer 60. FIG. 7 does not illustrate the insulating layers as insulators of the board 12 and the housing 11, either.

The vertical sections 51v and 52v are spaced apart from each other in the second direction. The vertical sections 52v are longer than the vertical sections 51v in the third direction.

Extensions 51h2 of the horizontal sections 51h intersect with the third direction between the ends 51va opposite to the extensions 51h1 and ends 61c of the extension 61 of the ground layer 60 in the vertical sections 51v. The ends 61c are closer to the ends 400a than to the ends 400b. Extensions 52h3 intersect with the third direction between ends 52va opposite to the extensions 52h2 and ends 52a of the extensions 52h1 in the vertical section 52v. The ends 52a are closer to the ends 400a than to the ends 400b.

The extensions 51h1 and 51h2 are parts of the horizontal sections 51h of the wires 51, and the extensions 52h1 (52h1a and 52h1b), 52h2, and 52h3 are examples of the horizontal sections 52h of the wires 52.

In the above configuration, the terminals 402 and 403 are electrically connected to the card controller 14 via the wires 52 including the extensions 52h2, the vertical sections 52v, and the extensions 52h3, and the extensions 52h1. The terminals 401 and 404 are electrically connected to the ground layer 60 including the extension 61 via the wires 51 including the extensions 51h1, the vertical sections 51v, and the extensions 51h2.

In the present embodiment, as illustrated in FIG. 4, while the memory card 10 is set in the host device, contact positions Pc of the terminals 402, 403, 405, and 406 with the contact of the host device are set to be closer to the ends 400b (the second end) than to the ends 400a (the first end). As described above, the wires 52 that electrically connect the terminals 402, 403, 405, and 406 and the card controller 14 extend from the ends 400a (the first ends). Assumed that the wires 52 extend from the ends 400b closer to the contact positions Pc than to the end 400a, there will be a relatively large area, in the terminals 400, to be a stub structure of a conductor with an open end (the area is hereinafter referred to as open-circuited stub area) between the contact positions Pc and the ends 400a, which will likely cause a resonance phenomenon at a specific frequency to deteriorate signals including decrease in signal intensity, for example. In this aspect, in the present embodiment the wires 52 extend from the ends 400a farther from the contact positions Pc than the ends 400b. Hence, according to the embodiment, for example, it is possible to reduce the open-circuited stub area having the structure of the conductor with the open end, which would otherwise cause a resonance phenomenon in the terminals 400, and to prevent signal deterioration such as a reduction in signal intensity at a specific frequency.

Figure 8:
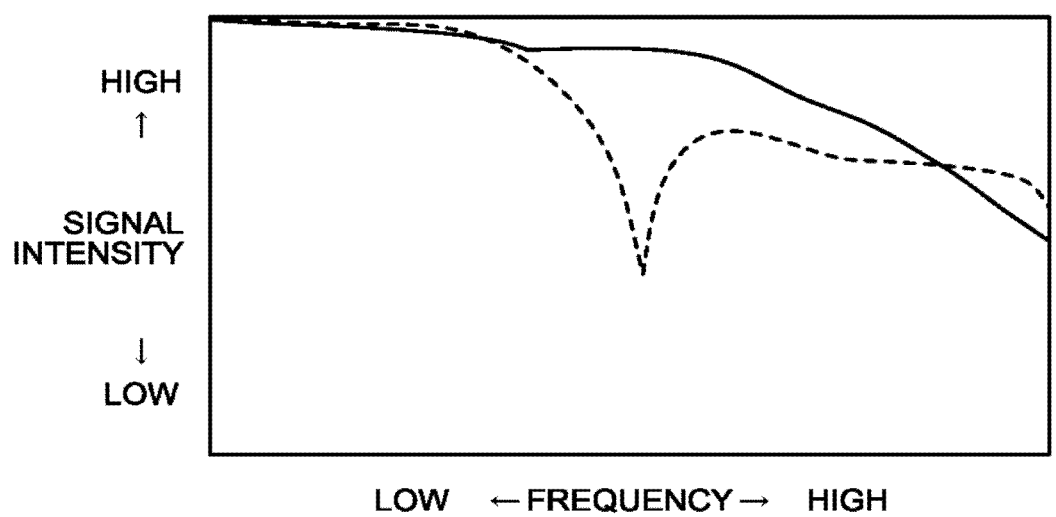
FIG. 8 is a schematic graph illustrating an example of frequency characteristics of signal intensity of the semiconductor storage device of the first embodiment.

FIG. 8 is a graph illustrating an example of frequency characteristics of the intensity of the signals transmitted by the terminals 402 and 403. In the graph, the horizontal axis indicates frequency, the vertical axis indicates signal intensity (logarithm), the broken line indicates frequency characteristics in a structure of the wires 52 extending only from the ends 400b, and the solid line indicates frequency characteristics in the wiring structure extending from the ends 400a, that is, the structure of the embodiment. As indicated by the broken line in FIG. 8, in the case of the wires 52 extending only from the ends 400b, a relatively large open-circuited stub area occurs between the contact positions Pc and the ends 400a so that the signal intensity drops significantly at a specific frequency. In contrast, as indicated by the solid line in FIG. 8, according to the embodiment no open-circuited stub area, which causes the drop of signal intensity as indicated by the broken line, occurs, resulting in more proper frequency characteristics.

In order to achieve the open-circuited stub-area reducing effect, the memory card 10 to be inserted into the socket of the host device needs to be configured that the first direction (X direction) matches the insertion or mounting direction into the socket of the host device. In other words, the wires 52 that electrically connect the terminals 402 and 403 and the card controller 14 need to extend from the front ends 400a in the insertion direction. A push-push socket having a one-way guide such as a heart cam mechanism requires a certain distance between the contact positions Pc and the ends 400b in the terminals 402 and 403. The heart cam mechanism includes, for example, a slider that moves together with the memory card 10, a rail having a return prevention step for the slider, and a return spring that biases the slider. The certain distance is set to be slightly longer than a distance between a maximum pressed position and a holding position, in which the contact is at the contact position Pc, of the memory card 10 in the first direction.

In a push-pull socket into which the memory card 10 is pressed or inserted in one direction and pulled out or extracted in the opposite direction, the certain distance between the contact positions Pc and the ends 400b in the terminals 402 and 403 can be set to a shorter distance. For example, the contact positions Pc can be set at or near the ends 400b.

In the embodiment, as can be seen from FIG. 5, the extensions 52h1 of the wires 52 being the signal wires are spaced apart from the terminals 400 in the third direction, i.e., Z direction, and as illustrated in FIG. 4, are located between the adjacent terminals 402 and 403 in the second direction when viewed in the third direction. Hence, according to the embodiment, the extensions 52h1 and any of the terminals 400 can be spaced further apart than, for example, the extensions 52h1 extending in the first direction, overlapping with the terminals 400 in the second or third direction. This can prevent deterioration of signals to be transmitted along the extensions 52h1.

Moreover, in the embodiment, as can be seen from FIG. 4, the terminal 402 (the first signal terminal) and the terminal 403 (the second signal terminal), which transmit differential signals, are adjacent to each other with a gap in the second direction, i.e., Y direction. As can be seen from FIG. 7, the extensions 52h1a (a first extension) electrically connected to the terminal 402, and the extension 52h1b (a second extension) electrically connected to the terminal 403 are adjacent to each other with a gap in the second direction, and extend in the first direction with a constant gap in the second direction. Hence, according to the embodiment, for example, differential signals are transmitted from the adjacent terminals 402 and 403 and the adjacent extensions 52h1a and 52h1b with the gap, thereby offsetting a magnetic field generated by the signal transfer and reducing noise. The terminal 402 is an example of the first signal terminal. The terminal 403 is an example of the second signal terminal. The wire 52 electrically connected to the terminal 402 is an example of first signal wiring. The wire 52 electrically connected to the terminal 403 is an example of second signal wiring. The extensions 52h1a are an example of the first extension. The extensions 52h1b are an example of the second extension. The extensions 52h1a and 52h1b and the extension 61 of the ground layer 60 form microstrip lines.

Moreover, in the embodiment, as can be seen from FIG. 5, the extensions 52h1a (the first extension) and the extensions 52h1b (the second extension) are spaced apart from the terminals 400 in the third direction, i.e., Z direction, and as can be seen from FIG. 4, are located between the adjacent terminals 402 and 403 in the second direction, i.e., Y direction when viewed in the third direction. Hence, according to the embodiment, for example, the extensions 52h1a and 52h1b can be spaced further apart from the terminals 402 and 403 than the extensions 52h1a and 52h1b extending in the first direction, overlapping with the terminals 402 and 403 in the second or third direction. This can prevent deterioration of differential signals transmitted along the extensions 52h1a and 52h1b. In addition, the length of the conductor between the terminal 402 and the extension 52h1a and between the terminal 403 and the extension 52h1b can be further reduced from when the extensions 52h1a and 52h1b are placed to overlap the gap other than the one between the terminals 402 and 403, that is, the gap between the terminals 400 other than the terminals 402 and 403, when viewed in the third direction). This can also contribute to preventing deterioration of differential signals that are transmitted along the extensions 52h1a and 52h1b.

Moreover, in the embodiment, as can be seen from FIGS. 4 and 5, the wire 52 (the first signal wiring) from the terminal 402 to the extension 52h1a and the wire 52 (the second signal wiring) from the terminal 403 to the extension 52h1b are symmetric with respect to a virtual plane Ps being a reference plane passing the midpoint between the terminals 402 and 403 and extending in the first direction (X direction) and the third direction (Z direction). Hence, according to the embodiment, deterioration of differential signals can be further prevented than when the wires 52 (the first and second signal wires) are not plane-symmetrical.

Moreover, in the embodiment, as can be seen from FIG. 5, the extension 61 of the ground layer 60 lies between the terminals 402 and 403 and the extensions 52h1a and 52h1b (52h1). This can further prevent deterioration of signals that are transmitted along the extensions 52h1 than when the extension 61 is not interposed between the terminals 402 and 403 and the extensions 52h1.

Moreover, in the embodiment, as can be seen from FIGS. 4 and 5, the ends 61a and 61b of the extension 61 in the second direction (Y direction) overlap, in the third direction (Z direction), with the opposing ends 402a and 403a of the terminals 402 and 403 in the second direction. The extension 61 narrower in width in the second direction and not overlapping with the ends 402a and 403a will decrease the signal-deterioration preventing effect. Conversely, the extension 61 wider in width and more greatly overlapping with the terminals 402 and 403 will increase parasitic capacitance between the extension 61 and the terminals 402 and 403, likely causing signal deterioration. In this aspect, according to the embodiment, the ends 61a and 61b are superposed, in the third direction, on the opposing ends 402a and 403a of the terminals 402 and 403 in the second direction, which makes it possible to avoid an inconvenience due to a too narrow or too wide extension 61, and attain more proper signal characteristics. The end 402a is an example of a first edge, and the end 403a is an example of a second edge.

The first embodiment describes the exemplary structures of the conductors corresponding to the terminals 400 in FIGS. 4 to 7. Such conductor structures can also be applied to other terminals 400. In other words, the conductor structures corresponding to the terminals 401 to 407 illustrated in FIG. 4 can also be applied to conductors corresponding to the terminals 407 to 413. The structures of the conductors and the board 12 corresponding to the terminals 401 to 404, which are illustrated in FIGS. 5 to 7, can also be applied to conductors corresponding to the terminals 404 to 407, the terminals 407 to 410, and the terminals 410 to 413.

Second Embodiment

Figure 9:
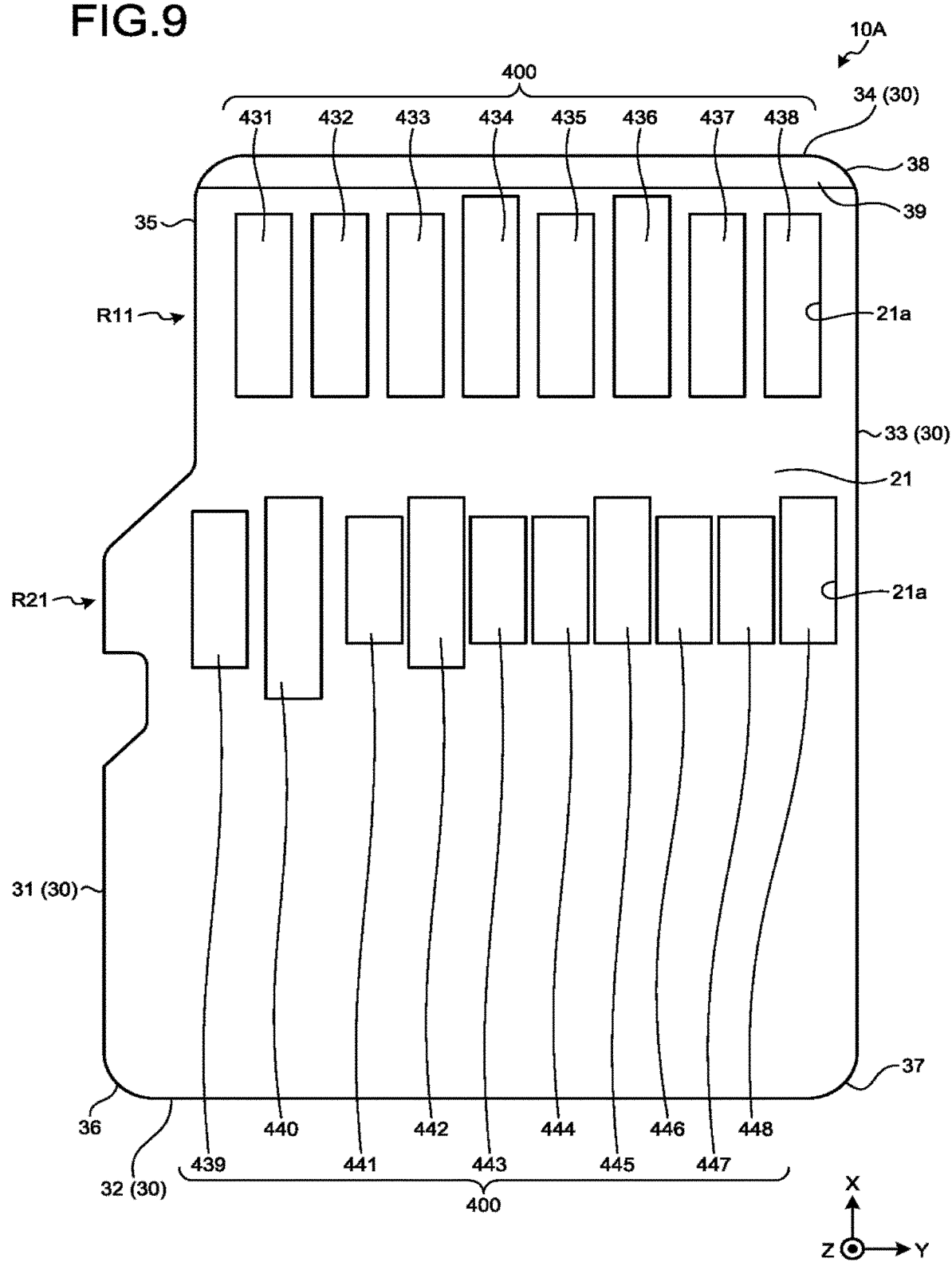
FIG. 9 is a schematic and illustrative plan view of a semiconductor storage device of a second embodiment.

FIG. 9 is a plan view of a memory card 10A of a second embodiment. Specifications of the memory card 10A including dimension and shape can correspond to those of a microSD card.

A first row R11 of terminals 431 to 438 (400) are assigned with signals used in SD communication mode. In SD communication mode single-ended signal can be used. In SD mode, a command CMD is assigned to the terminal 433, a power supply VDD is assigned to the terminal 434, a clock CLK is assigned to the terminal 435, a ground potential VSS is assigned to the terminal 436, and data DAT0 to 3 are assigned to the terminals 437, 438, 431, and 432. In SD mode, communication pursuant to default speed (DS), high speed (HS), or ultra high speed-I (UHS-I) can be carried out.

Signals used in PCIe communication are assigned to a second row R21 of terminals 439 to 448 (400). In PCIe communication, differential signals can be used. In PCIe, receiver differential signals RX0P and RX0N are assigned to the terminals 446 and 447, transmitter differential signals TX0P and TX0N are assigned to the terminals 443 and 444, and a ground potential (GND) is assigned to the terminals 442, 445, and 448. The terminal pair 443 and 444 and the terminal pair 446 and 447 each transmit a differential data signal (differential signal) pair. The terminals 443 and 446 are first signal terminals, and the terminals 444 and 447 are second signal terminals. The receiver differential signals RX0P and RX0N and the transmitter differential signals TX0P and TX0N are examples of a differential signal and a differential data signal. The terminals 443, 444, 446, and 447 are examples of a differential signal terminal and a differential data signal terminal.

The terminals 446 and 447 to which the receiver differential signals RX0P and RX0N are assigned are located between two terminals 445 and 448 to which the ground potential is assigned. The terminals 443 and 444 to which the transmitter differential signals TX0P and TX0N are assigned are located between two terminals 442 and 445 to which the ground potential is assigned.

In the second row R21, a third power supply VDD3 is assigned to the terminal 439, a second power supply VDD2 is assigned to the terminal 440, and SWIO is assigned to the terminal 441. SWIO can be used in near field communication (NFC).

Control signals used to control PCIe communication are assigned to the terminals 431 to 438 (400) in the first row R11. The control signals are a reference differential clock signal REFCLKp/n, a reset signal PERST, and a power management control signal CLKREQ and a wakeup signal PEWAKE. These control signals are assigned in place of the command CMD and the data DAT0 to 3 in the first row R11.

Two reference differential clock signals REFCLKp/n serve as a differential clock. The host device transmits a clock to establish synchronization with the memory card 10A.

The wiring structure as in the first embodiment can also be adopted for the terminals 442 to 448 of the memory card 10A of the second embodiment.

Modification of Second Embodiment

Figure 10:
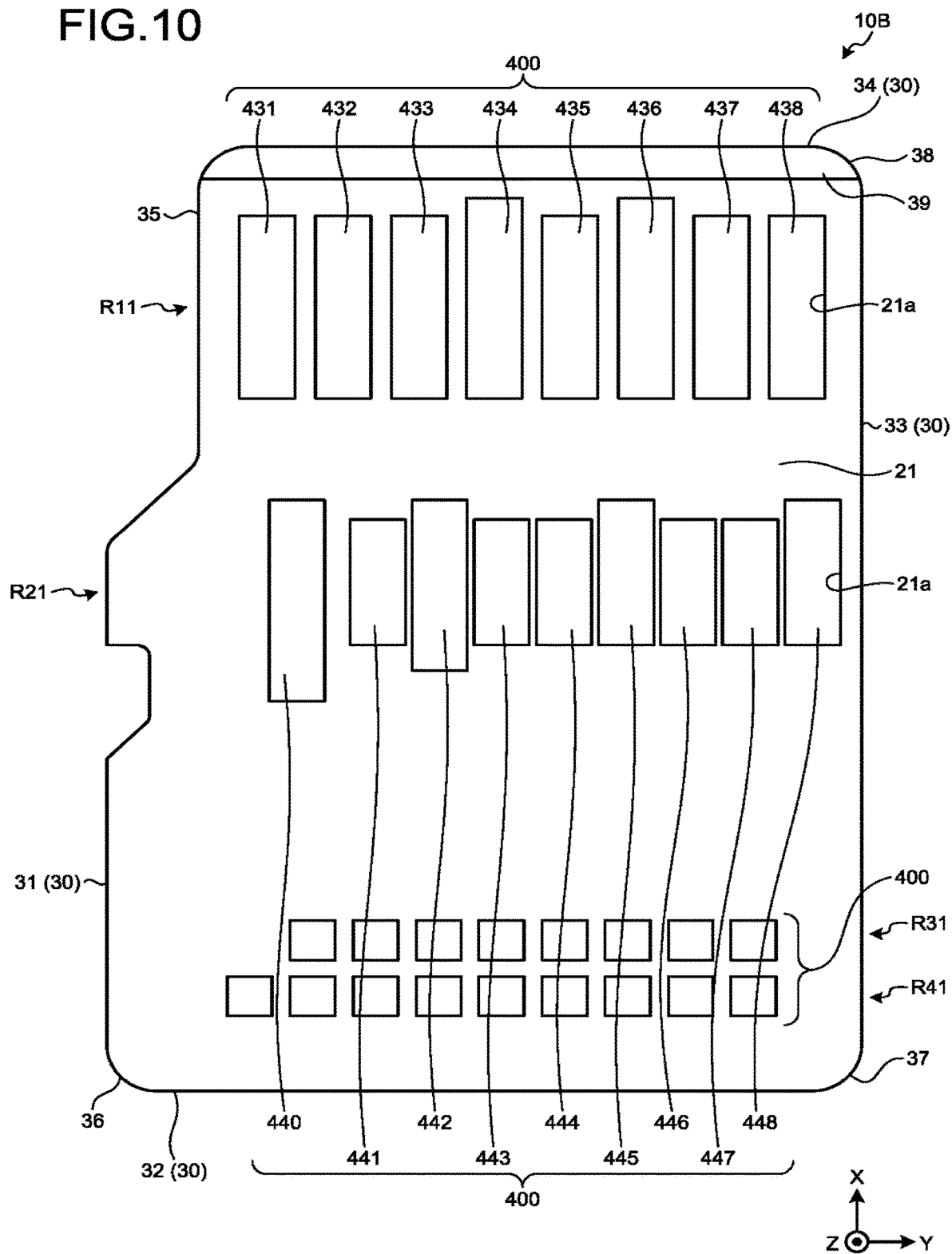
FIG. 10 is a schematic and illustrative plan view of a semiconductor storage device of a modification of the second embodiment.

FIG. 10 is a plan view of a memory card 10B of a modification. Specifications of the memory card 10B including dimension and shape can correspond to a microSD card.

The memory card 10B includes a third row R31 and a fourth row R41 in addition to a first row R11 and a second row R21 similar to those in the second embodiment.

The arrangement and shape of the terminals 400 in the third row R31 and the fourth row R41 are not limited to the ones in FIG. 10. The exposed area of each terminal 400 in the third row R31 and the fourth row R41 is smaller than that of each terminal 400 in the first row R11 and the second row R21, but is not limited thereto.

Signals used in PCIe communication are assigned to the terminals 400 in the third row R31 and the fourth row R41. For example, transmitter differential signals TX0P and TX0N and receiver differential signals RX0P and RX0N are assigned to the terminals 400 in the third row R31. Transmitter differential signals TX1P and TX1N and receiver differential signals RX1P and RX1N are assigned to the terminals 400 in the fourth row R41.

The wiring structure as in the first embodiment can also be adopted for the terminals 442 to 448 of the memory card 10B of the modification, as in the second embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. Moreover, the configurations and shapes in the embodiments can also be partially interchanged to carry out the embodiments. Moreover, the specifications for configuration, shape, and the like (structure, kind, direction, form, size, length, width, thickness, height, angle, number, placement, location, material, and the like) can be changed as appropriate to carry out the embodiments.

What is claimed is:

1. A semiconductor storage device, comprising:
a housing including a first face and a second face opposite to the first face;
a plurality of terminals that is exposed to the first face, extends in a first direction, and is spaced apart from each other in a second direction intersecting with the first direction;
signal terminals of the plurality of terminals, each of the signal terminals including a first end in the first direction, and a second end opposite to the first end in the first direction, the second end being closer to a contact position with a contact of a host device than the first end is to the contact position;
a controller in the housing;
signal wiring that extends from the first end in the housing to electrically connect the first end and the controller; and
a memory electrically connected to the controller in the housing, wherein
the first face and the second face intersect with a third direction, the third direction intersecting with the first and second directions.

2. The semiconductor storage device according to claim 1, wherein
the signal wiring includes an extension that is spaced apart from the plurality of terminals in the third direction, the extension extending in the first direction between adjacent terminals as viewed in the third direction.

3. The semiconductor storage device according to claim 2, further comprising
a ground layer between the extension and the signal terminals, the ground layer including a first area extending in the first direction.

4. The semiconductor storage device according to claim 1, wherein
the signal terminals include a first signal terminal;
the signal terminals include a second signal terminal that is adjacent to the first signal terminal with a gap in the second direction, and transmits a differential signal together with the first signal terminal;
the signal wiring includes first signal wiring that electrically connects the first signal terminal and the controller; and
the signal wiring includes second signal wiring that electrically connects the second signal terminal and the controller.

5. The semiconductor storage device according to claim 4, wherein
the first signal wiring includes a first extension that is spaced apart from the first and second signal terminals in the third direction intersecting with the first and second directions, the first extension extending in the first direction between the first and second signal terminals as viewed in the third direction, and the second signal wiring includes a second extension that is spaced apart from the first and second signal terminals in the third direction, the second extension extending substantially in parallel to the first extension in the first direction between the first and second signal terminals as viewed in the third direction.

6. The semiconductor storage device according to claim 5, further comprising a ground layer including a first area extending in the first direction between the first extension and the first signal terminal and between the second extension and the second signal terminal.

7. The semiconductor storage device according to claim 6, wherein the first area overlaps with a first edge of the first signal terminal and a second edge of the second signal terminal in the third direction, the first edge and the second edge opposing each other with a gap in the second direction.

* * * * *